US010582638B2

(12) United States Patent
Ye

(10) Patent No.: US 10,582,638 B2
(45) Date of Patent: Mar. 3, 2020

(54) LINKAGE FAN BLADE STRUCTURE AND FLIP-TYPE ELECTRONIC DEVICE HAVING THE SAME

(71) Applicant: PEGATRON CORPORATION, Taipei (TW)

(72) Inventor: Chang-Xin Ye, Taipei (TW)

(73) Assignee: Pegatron Corporation, Taipei (TW)

(*) Notice: Subject to any disclaimer, the term of this patent is extended or adjusted under 35 U.S.C. 154(b) by 0 days.

(21) Appl. No.: 16/249,393

(22) Filed: Jan. 16, 2019

(65) Prior Publication Data
US 2019/0278345 A1     Sep. 12, 2019

(30) Foreign Application Priority Data

Mar. 6, 2018 (TW) .............................. 107107450 A

(51) Int. Cl.
| H05K 7/20 | (2006.01) |
| G06F 1/20 | (2006.01) |
| F24F 13/14 | (2006.01) |
| G06F 1/16 | (2006.01) |
| F24F 13/15 | (2006.01) |

(52) U.S. Cl.
CPC ....... H05K 7/20009 (2013.01); F24F 13/142 (2013.01); F24F 13/15 (2013.01); G06F 1/1656 (2013.01); G06F 1/203 (2013.01)

(58) Field of Classification Search
CPC .... G06F 1/1616; G06F 1/203; H04M 1/0216; F04D 25/14; F24F 13/14; F24F 13/1413; F24F 13/142; F24F 13/15
See application file for complete search history.

(56) References Cited

U.S. PATENT DOCUMENTS

| 2,394,059 A * | 2/1946 | Hite ........................ F24F 13/15 49/91.1 |
| 2,453,703 A * | 11/1948 | De Carlo, Sr. ....... F25D 17/045 62/265 |
| 2,793,580 A * | 5/1957 | Hope ...................... F04D 25/14 454/351 |

(Continued)

FOREIGN PATENT DOCUMENTS

| CN | 206684664 U | 11/2017 |
| TW | 201416826 A | 5/2014 |

(Continued)

*Primary Examiner* — Robert J Hoffberg
(74) *Attorney, Agent, or Firm* — Muncy, Geissler, Olds & Lowe, P.C.

(57) ABSTRACT

The present disclosure relates to a heat dissipation hole structure of a flip-type electronic device. The heat dissipation hole structure includes a first connecting rod, a second connecting rod, and a blade group. The flip-type electronic device includes a base, an upper cover, and a pivot. Two ends of the first connecting rod are respectively pivoted to the pivot and the second connecting rod. The second connecting rod is further pivoted to the blade group. The blade group is disposed in an opening of the base and includes two blades. The two blades are both pivoted to an inner surface of the opening, and one end of each of the two blades is slidably connected to each other. In this way, when the upper cover is opened, the pivot drives the blade group through the first connecting rod and the second connecting rod, so that the two blades rotate.

11 Claims, 14 Drawing Sheets

(56) References Cited

U.S. PATENT DOCUMENTS

| | | | | |
|---|---|---|---|---|
| 4,217,816 A * | 8/1980 | Mancinelli | ............... | F04D 25/14 415/125 |
| 4,513,655 A * | 4/1985 | Dayus | ................. | F24F 13/1486 454/318 |
| 5,288,202 A * | 2/1994 | Mancinelli | ............... | F04D 25/14 415/211.2 |
| 6,229,701 B1 * | 5/2001 | Kung | ...................... | G06F 1/203 165/185 |
| 6,496,369 B2 * | 12/2002 | Nakamura | ............ | G06F 1/1616 165/80.3 |
| 7,075,788 B2 * | 7/2006 | Larson | ...................... | G06F 1/20 165/185 |
| 7,079,387 B2 * | 7/2006 | Brooks | ...................... | G06F 1/20 165/185 |
| 7,184,278 B2 * | 2/2007 | Tsai | ........................ | G06F 1/203 361/752 |
| 7,871,319 B2 * | 1/2011 | Tracy | ..................... | G06F 1/206 454/184 |
| 8,014,147 B2 * | 9/2011 | Chen | ..................... | G06F 1/1616 200/61.62 |
| 8,218,313 B2 * | 7/2012 | Cheng | .................... | G06F 1/166 248/188.2 |
| 8,542,487 B2 * | 9/2013 | Kobayashi | ......... | H05K 7/20572 361/695 |
| 8,730,663 B2 * | 5/2014 | Du | ......................... | G06F 1/203 361/679.01 |
| 9,261,926 B2 * | 2/2016 | Larsen | ................... | G06F 1/203 |
| 9,740,253 B2 * | 8/2017 | Cheng | ................... | G06F 1/203 |
| 2007/0053143 A1 * | 3/2007 | Kang | ..................... | G06F 1/203 361/678 |
| 2009/0321047 A1 * | 12/2009 | Chen | ...................... | G06F 1/203 165/80.3 |
| 2012/0003912 A1 * | 1/2012 | Hoover | .............. | H05K 7/20727 454/184 |

FOREIGN PATENT DOCUMENTS

| | | |
|---|---|---|
| TW | I496532 B | 8/2015 |
| TW | I547234 B | 8/2016 |
| TW | 201715941 A | 5/2017 |

* cited by examiner

LINKAGE FAN BLADE STRUCTURE AND FLIP-TYPE ELECTRONIC DEVICE HAVING THE SAME

CROSS-REFERENCE TO RELATED APPLICATIONS

This application claims the priority benefit of Taiwan application serial no. 107107450, filed on Mar. 6, 2018. The entirety of the above-mentioned patent application is hereby incorporated by reference herein and made a part of this specification.

BACKGROUND OF THE INVENTION

1. Field of the Invention

The present disclosure relates to a heat dissipation hole structure of a flip-type electronic device, and in particular, to a linkage-type fan blade heat dissipation hole structure of a notebook computer.

2. Description of the Prior Arts

A portable electronic device in the prior art is usually provided with a heat dissipation hole to help eliminate heat generated by an electronic element. In addition, for the reason of equipped with elements that easily generate heat such as a display card, the notebook computer more needs a heat dissipation hole to help with heat dissipation.

However, referring to FIG. 16, the safety regulation standard certification (briefly referred to as safety regulation) of the notebook computer clearly defines that a heat dissipation hole 100 is not allowed by a round bar with a diameter of 0.9 mm or more. For example, when the heat dissipation hole 100 is an elongated hole, the width of the heat dissipation hole 100 cannot be greater than 0.9 mm. Under this condition plus consideration for the structural strength of an area of heat dissipation holes, the opening rate (the area of the heat dissipation hole divided by the entire area) of the area of the heat dissipation hole is usually easily caused to be only approximately 40%. Therefore, the heat dissipation effect is unsatisfactory, and the efficiency of electronic elements of the notebook computer cannot be effectively improved.

Therefore, a heat dissipation hole structure of a portable electronic device in the prior art indeed needs to be improved.

SUMMARY OF THE INVENTION

In view of the foregoing disadvantages and deficiencies of the prior art, the present disclosure provides a linkage fan blade structure and a flip-type electronic device having the same, to enhance a heat dissipation effect.

To achieve the foregoing inventive objective, a technical means adopted in the present disclosure is to design a linkage fan blade structure, adapted to be disposed on a flip-type electronic device. The flip-type electronic device includes a base, an upper cover, and a pivot, where an opening is formed through a bottom surface of the base, the upper cover is pivoted to the base through the pivot, and the linkage fan blade structure includes at least one first connecting rod, at least one second connecting rod, and at least one blade group. One end of the at least one first connecting rod is pivoted to the pivot. One end of the at least one second connecting rod is pivoted to the other end of the at least one first connecting rod. The at least one blade group is pivoted to the at least one second connecting rod and disposed corresponding to the opening. Each of the at least one blade group includes a first blade and a second blade. The first blade is pivoted to an inner surface of the opening, where the first blade comprises at least one sliding slot, each of the at least one sliding slot includes a closed end and an open end, and the closed end is closer, than the open end, to a location where the first blade is pivoted to the opening. The second blade is pivoted to the inner surface of the opening, where the second blade includes a sliding end, and the sliding end is slidably pivotally disposed in the at least one sliding slot of the first blade.

To achieve the foregoing inventive objective, the present disclosure further provides a flip-type electronic device, including a base, an upper cover, a pivot, and the linkage fan blade structure stated above. The upper cover is pivoted to the base through the pivot. The linkage fan blade structure is disposed on the base, and is connected to the pivot.

The advantage of the present disclosure is that, when the upper cover is opened to use the flip-type electronic device, the pivot of the flip-type electronic device drives the blade group by the first connecting rod and the second connecting rod, so that the second blade of the blade group slides relative to the first blade, and the two blades respectively pivotally rotate relative to the base and protrude out of the opening of the base of the flip-type electronic device in an inclined manner. In this way, heat in the flip-type electronic device can be eliminated from two transverse end openings formed between the two blades. In this way, according to the present disclosure, heat can be eliminated from the lateral openings under the same area of the opening, thereby effectively improving the heat dissipation efficiency.

Further, the at least one blade group has a closed state and an open state. When the at least one blade group is in the closed state, the sliding end of the second blade is located on the closed end of the at least one sliding slot. When the at least one blade group is in the open state, the sliding end of the second blade is located on the open end of the at least one sliding slot, and the first blade and the second blade protrude out of the opening.

Further, when the upper cover of the flip-type electronic device is closed relative to the base, the at least one blade group is in the closed state. When the upper cover of the flip-type electronic device is opened relative to the base, the pivot drives, by using the at least one first connecting rod, the at least one second connecting rod to move, and the at least one second connecting rod drives the at least one blade group, so that the at least one blade group switches to the open state.

Further, the first blade and the second blade each include at least one heat dissipation hole. When the at least one blade group is in the closed state, the first blade is parallel to the second blade, and the at least one heat dissipation hole of the first blade is in communication with the at least one heat dissipation hole of the second blade.

Further, the at least one second connecting rod is pivoted to the first blade of the at least one blade group.

Further, the first blade is closer, than the second blade, to the pivot of the flip-type electronic device.

Further, the number of the at least one sliding slot of the first blade is two, and the two sliding slots are respectively disposed on two opposite sides of the first blade; and two opposite sides of the sliding end of the second blade are respectively located on outer sides of the two sliding slots of the first blade, and each of the two opposite sides of the sliding end of the second blade is provided with a sliding column, and the sliding column is slidably and relatively rotatably disposed in the corresponding sliding slot.

Further, the number of the at least one first connecting rod is two; and the number of the at least one second connecting rod is two, and the two second connecting rods are respectively pivoted to the two first connecting rods.

Further, the number of the at least one blade group is plural, and the blade groups are arranged along an extension direction of the at least one second connecting rod.

Further, the pivot includes a shaft body and an upper-cover combination base, the upper-cover combination base is relatively rotatably sleeved on the shaft body, the upper cover is combined with the upper-cover combination base, and the linkage fan blade structure is connected to the upper-cover combination base.

DETAILED DESCRIPTION OF THE PREFERRED EMBODIMENTS

Figure 1:
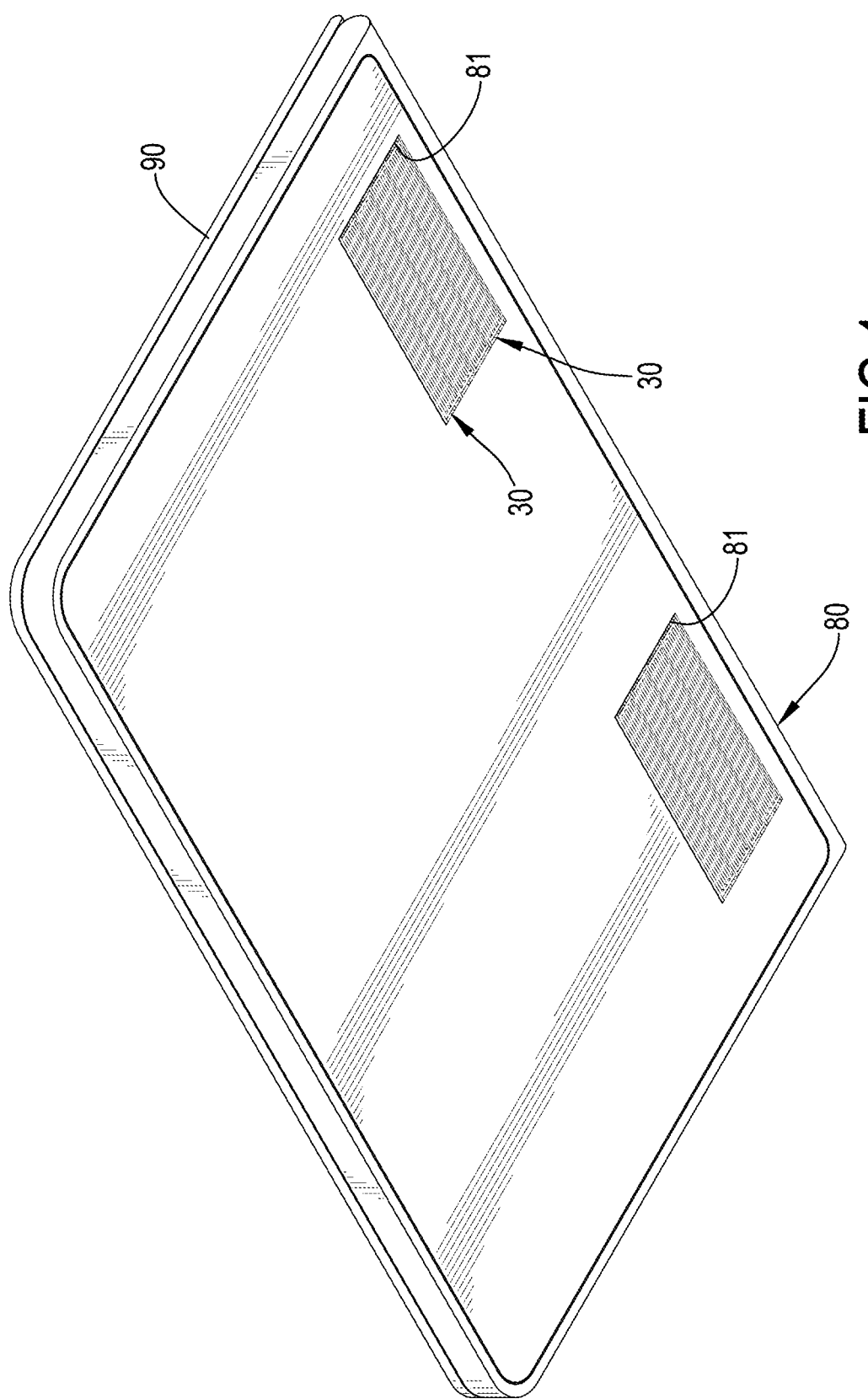
FIG. 1 is a three-dimensional appearance bottom view of a flip-type electronic device of the present disclosure.
Figure 5:
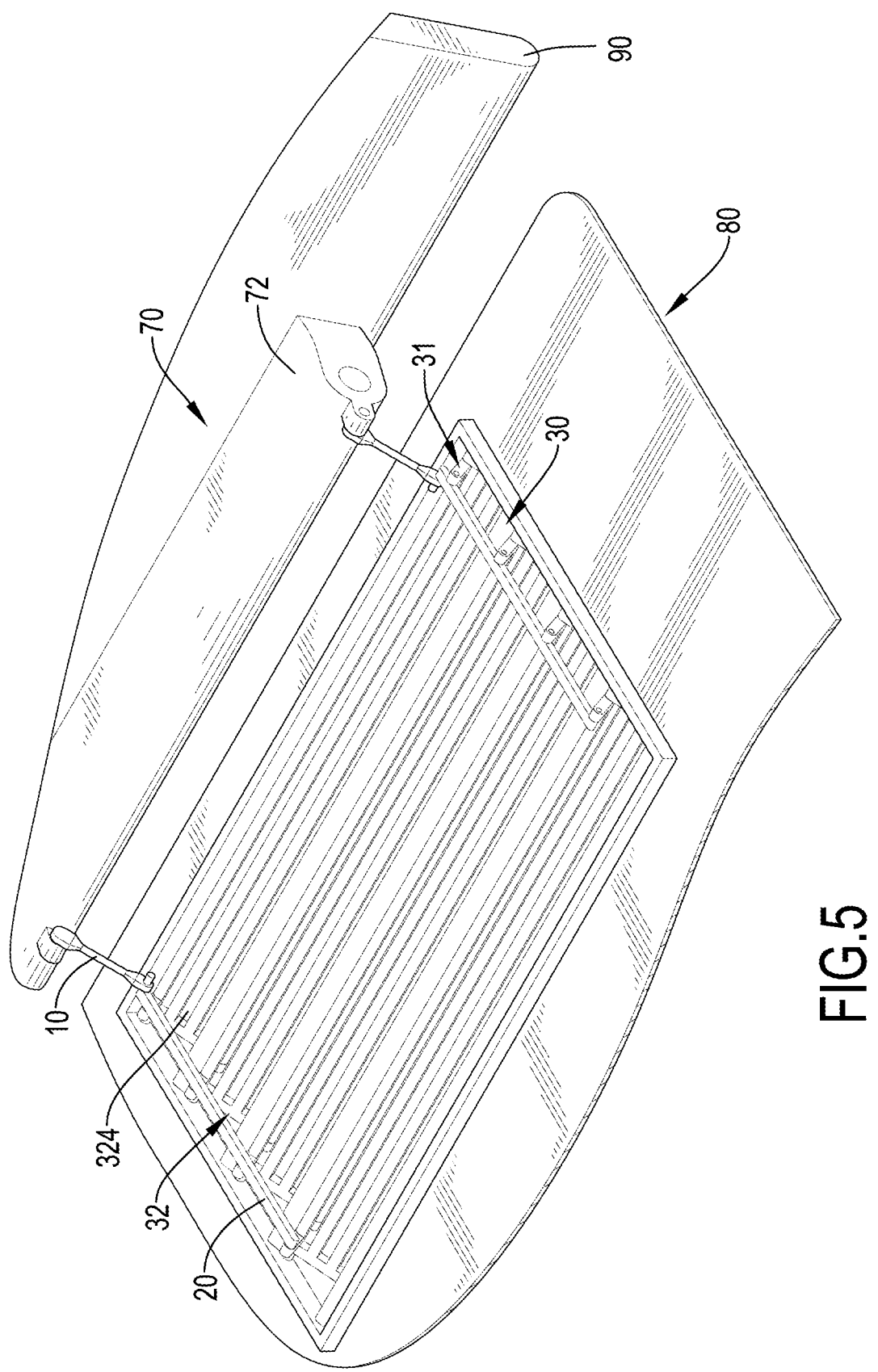
FIG. 5 is a three-dimensional appearance top view when a blade group of a linkage fan blade structure of the present disclosure is opened.
Figure 6:
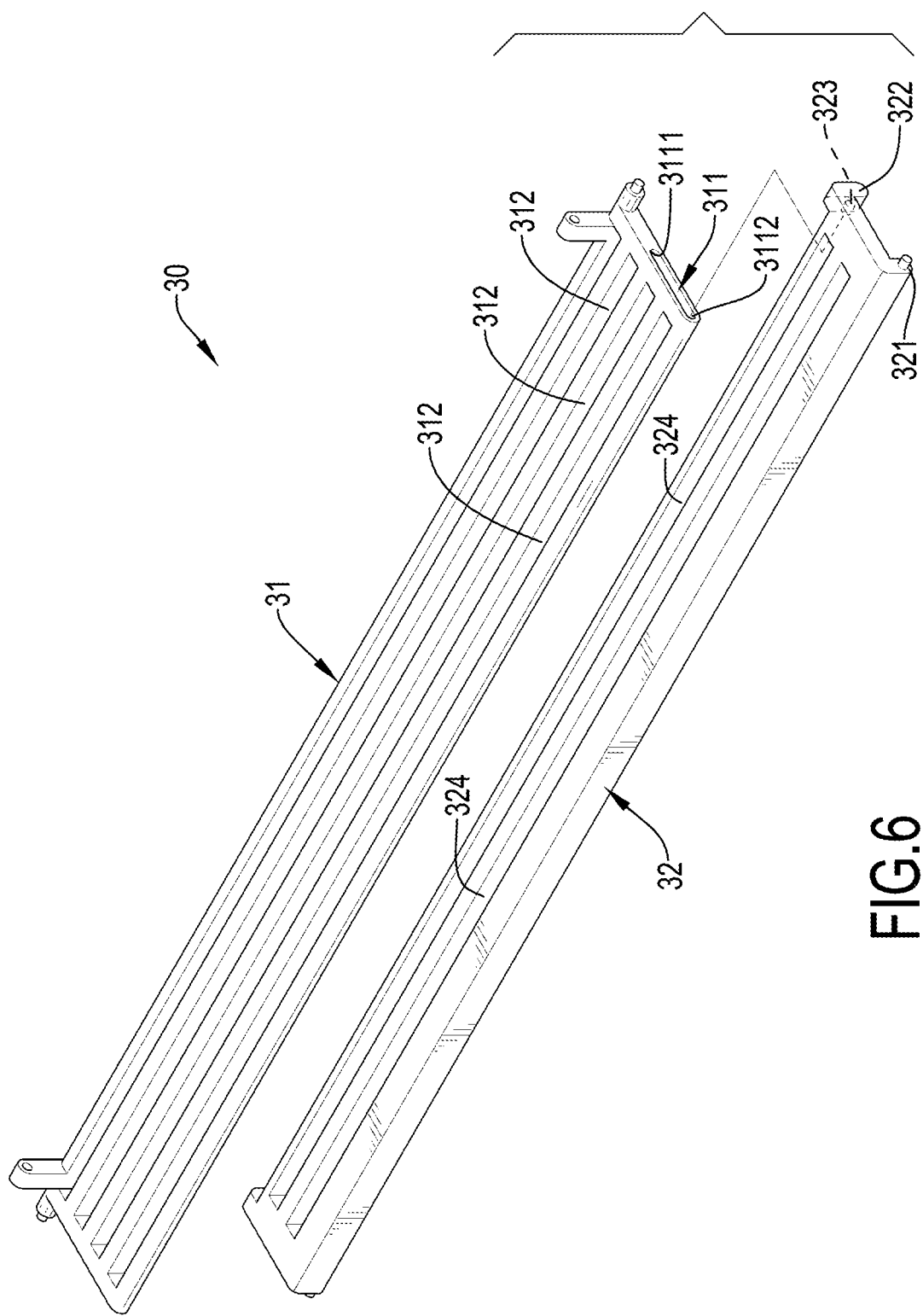
FIG. 6 is an exploded view of elements of a blade group of a first embodiment of a linkage fan blade structure of the present disclosure.

Referring to FIG. 1 and FIG. 5, a flip-type electronic device of the present disclosure includes a base 80, an upper cover 90, a pivot 70, and two linkage fan blade structures.

Figure 9:
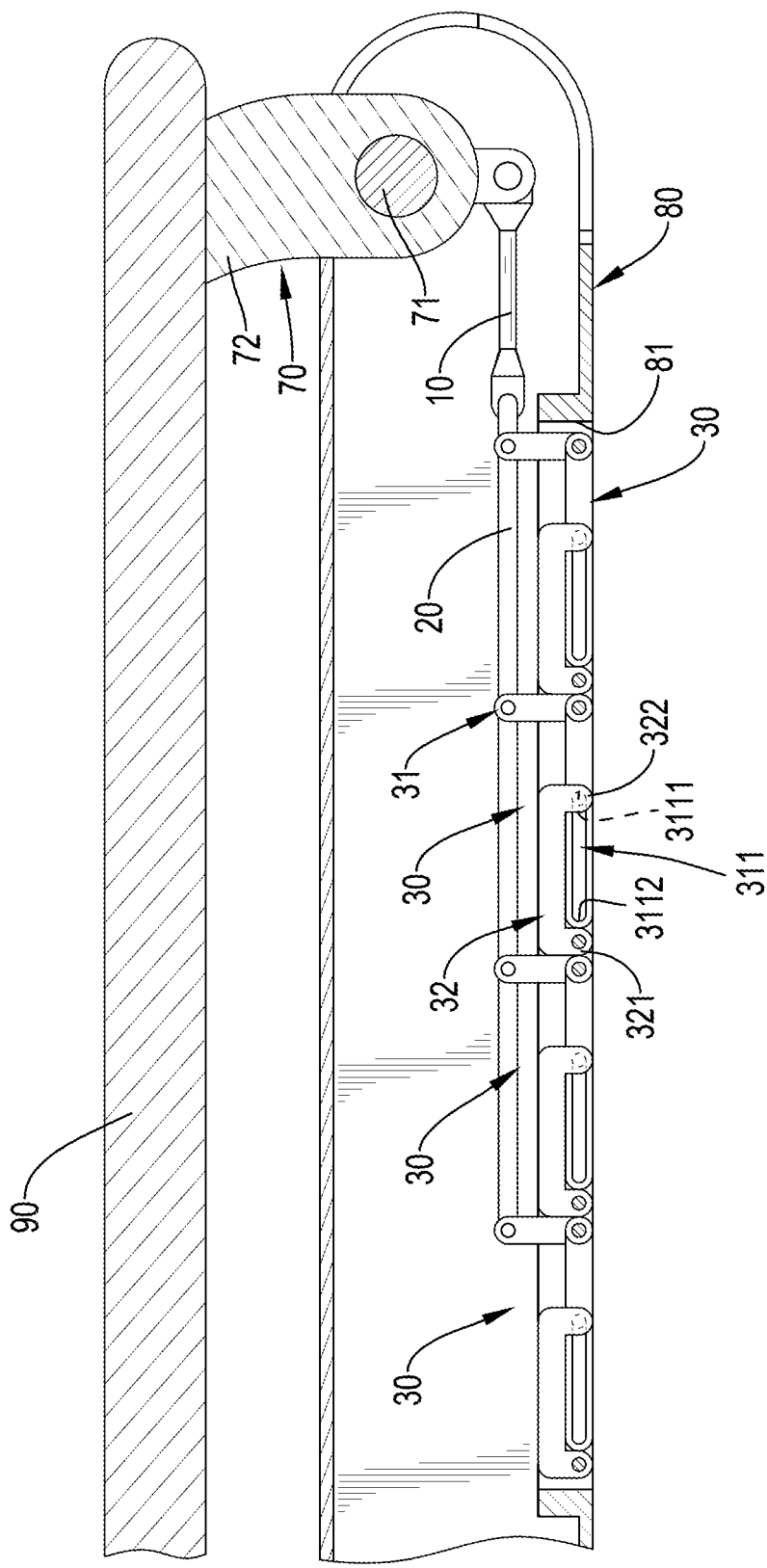
FIG. 9 to FIG. 11 are action diagrams of a first embodiment of a linkage fan blade structure of the present disclosure.

Referring to FIG. 1, FIG. 5, and FIG. 9, two openings 81 are formed through a bottom surface of the base 80, to respectively correspond to the two linkage fan blade structures. The upper cover 90 is pivoted to the base 80 through the pivot 70. In this embodiment, the pivot 70 includes a shaft body 71 and an upper-cover combination base 72 (as shown in FIG. 5 and FIG. 9). The upper-cover combination base 72 is relatively rotatably sleeved on the shaft body 71. The upper cover 90 is combined with the upper-cover combination base 72. The base 80 is fixedly disposed on the shaft body 71. The two linkage fan blade structures are connected to the upper-cover combination base 72. However, the present disclosure is not limited thereto. The pivot may also include a shaft body and a base combination base, which are respectively fixedly disposed on the upper cover and the base. The linkage fan blade structure is connected to the shaft body. Alternatively, the pivot may also include a shaft body, an upper-cover combination base, and a base combination base. The upper-cover combination base and the base combination base are respectively fixedly disposed on the upper cover and the base. The linkage fan blade structure is connected to the upper-cover combination base. In this embodiment, the flip-type electronic device is a notebook computer, but is not limited thereto.

Figure 4:
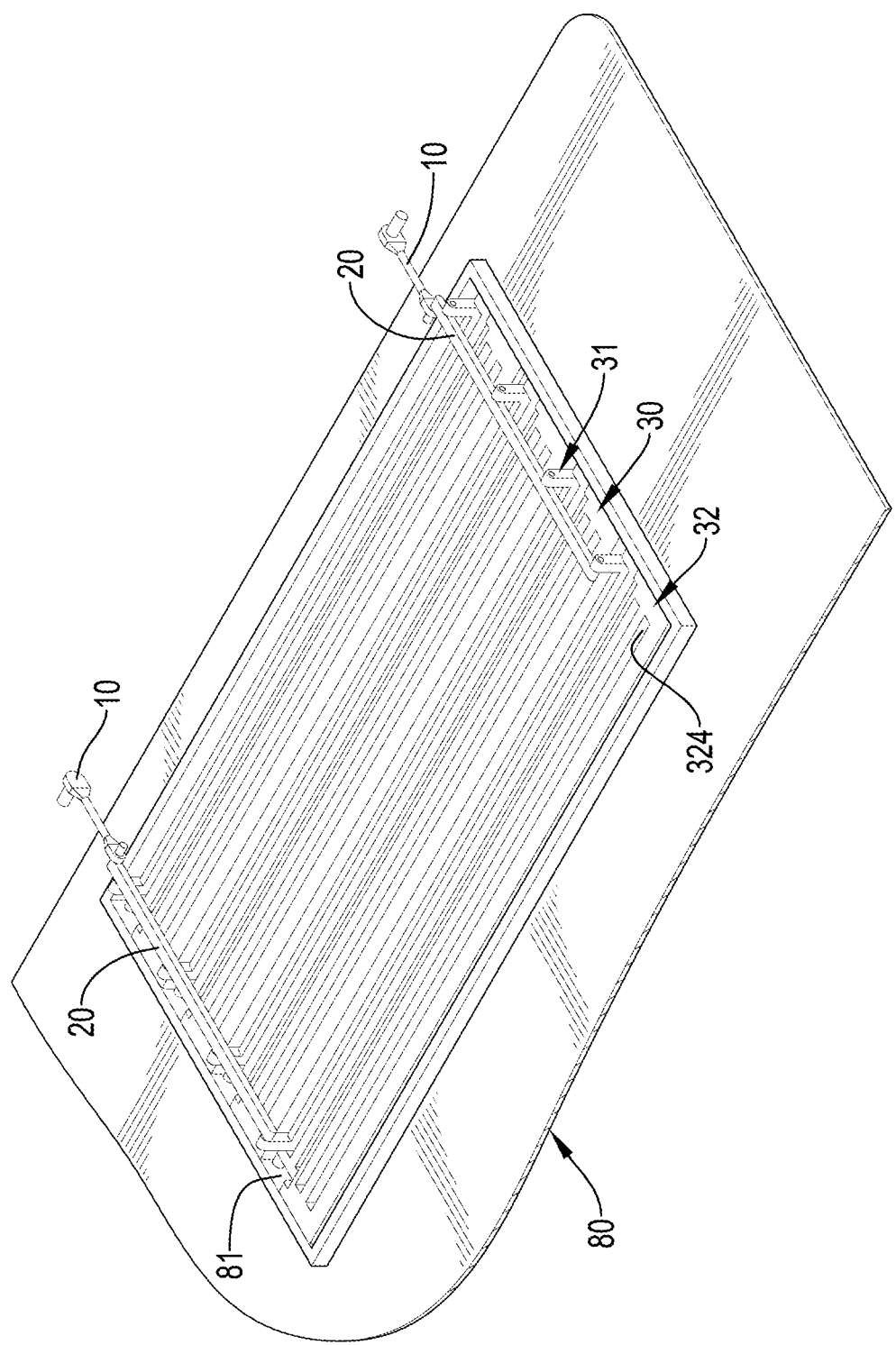
FIG. 4 is a three-dimensional appearance top view when a blade group of a linkage fan blade structure of the present disclosure is closed.
Figure 7:
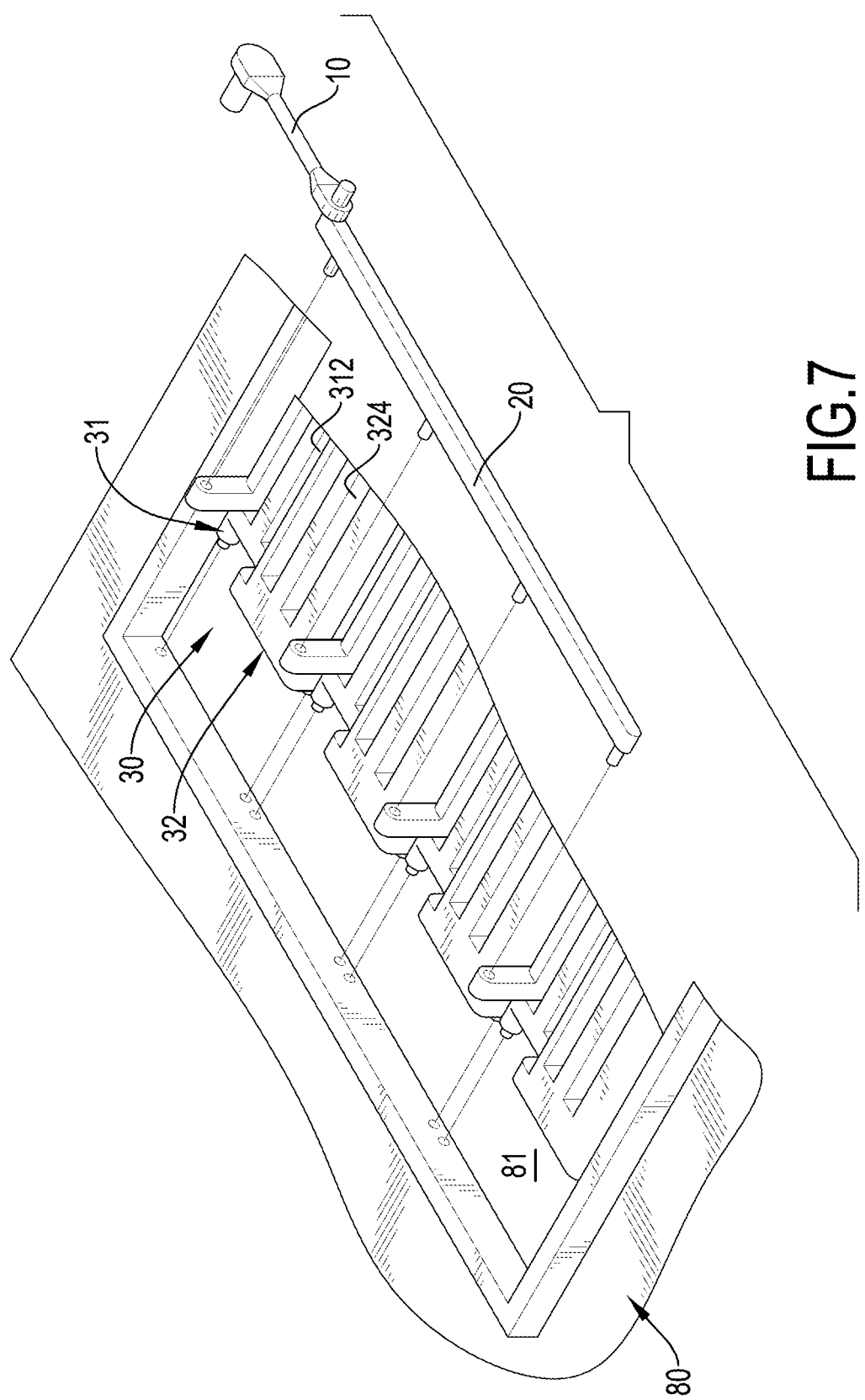
FIG. 7 is an exploded view of some elements of a first embodiment of a linkage fan blade structure of the present disclosure.

Referring to FIG. 4, FIG. 5, and FIG. 7, the foregoing linkage fan blade structure is disposed in the opening 81 of the base 80, and is connected to the pivot 70. The linkage fan blade structure includes two first connecting rods 10, two second connecting rods 20, and a plurality of blade groups 30.

The two first connecting rods 10 are disposed in parallel in a spaced manner. One end of each first connecting rod 10 is pivoted to the pivot 70. In this embodiment, one end of each first connecting rod 10 is pivoted to the upper-cover combination base 72 of the pivot 70.

The two second connecting rods 20 are disposed in parallel in a spaced manner. One end of each second connecting rod 20 is pivoted to the other end of each of the two first connecting rods 10.

Referring to FIG. 5 to FIG. 7 and FIG. 9, the blade groups 30 are disposed corresponding to the opening 81 of the base 80, and the blade groups 30 are arranged along an extension direction of the second connecting rod 20. The two second connecting rods 20 are respectively pivoted to two sides of the blade groups 30. Specifically, each blade group 30 includes a first blade 31 and a second blade 32.

Two opposite sides of the first blade 31 are respectively pivoted to inner surfaces of two opposite sides of the opening 81 of the base 80, and each of the two opposite sides of the first blade 31 includes a sliding slot 311. Each sliding slot 311 is an elongated slot and has a closed end 3111 and an open end 3112. The closed end 3111 is closer, than the open end 3112, to a location where the first blade 31 is pivoted to the opening 81 (as shown in FIG. 9). The first blade 31 has a plurality of heat dissipation holes 312. In this embodiment, each heat dissipation hole 312 is an elongated hole extending laterally, and the width of the elongated hole is less than or equal to 0.9 mm to satisfy the safety regulation. However, the shape of the heat dissipation hole is not limited thereto, and may also be changed to another shape.

Two opposite ends of the second blade 32 are respectively a pivotal end 321 and a sliding end 322. Two opposite sides of the pivotal end 321 of the second blade 32 are respectively pivoted to the inner surfaces of the two opposite sides of the opening 81 of the base 80. The sliding end 322 of the second blade 32 is slidably pivotally disposed in the sliding slot 311 of the first blade 31. In this way, when the second blade 32 or the first blade 31 receives an external force and pivotally rotates relative to the base 80, the second blade 32 or the first blade 31 drives the other blade to pivotally rotate relative to the base 80.

In this embodiment, two opposite sides of the sliding end 322 of the second blade 32 respectively extend to outer sides of two sliding slots 311 of the first blade 31, and each of the two opposite sides of the sliding end 322 of the second blade 32 is provided with a sliding column 323. The sliding column 323 is slidably and relatively rotatably disposed in the corresponding sliding slot 311. However, the structure that the sliding end 322 of the second blade 32 is slidably pivotally disposed in the sliding slot 311 of the first blade 31 is not limited thereto, and may also be changed to another structure or manner. For example, the sliding column 323 may also be replaced with an independent pivot that runs through the sliding end 322 of the second blade 32 and that is inserted into the sliding slot 311. The second blade 32 is provided with a plurality of heat dissipation holes 324. In this embodiment, each heat dissipation hole 324 is an elongated hole extending laterally, and the width of the elongated hole is less than or equal to 0.9 mm to satisfy the safety regulation. However, the shape of the heat dissipation hole is not limited thereto, and may also be changed to another shape.

In this embodiment, the blade group 30 has a closed state and an open state.

Figure 2:
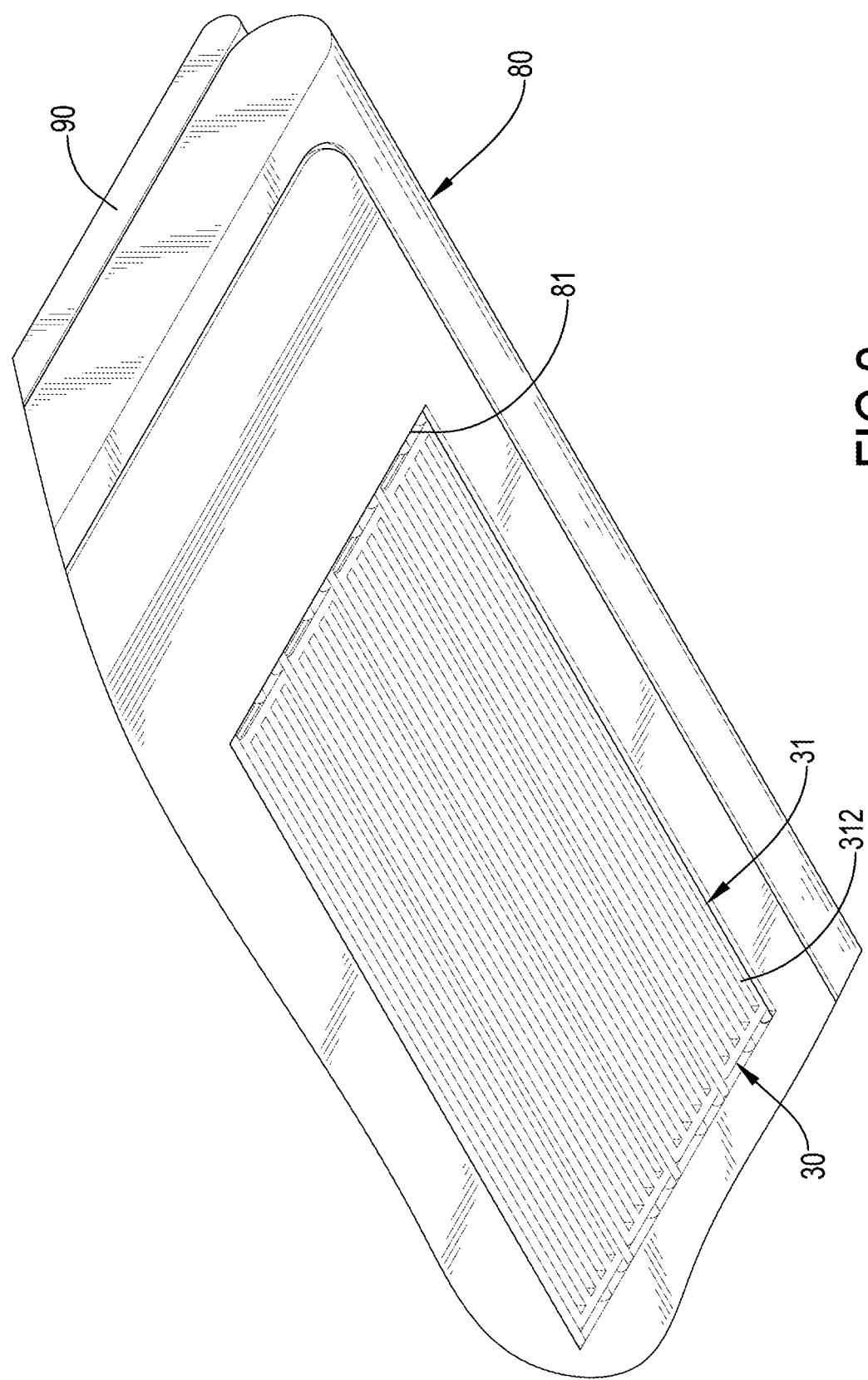
FIG. 2 is a three-dimensional appearance bottom view when a blade group of a linkage fan blade structure of the present disclosure is closed.
Figure 8:
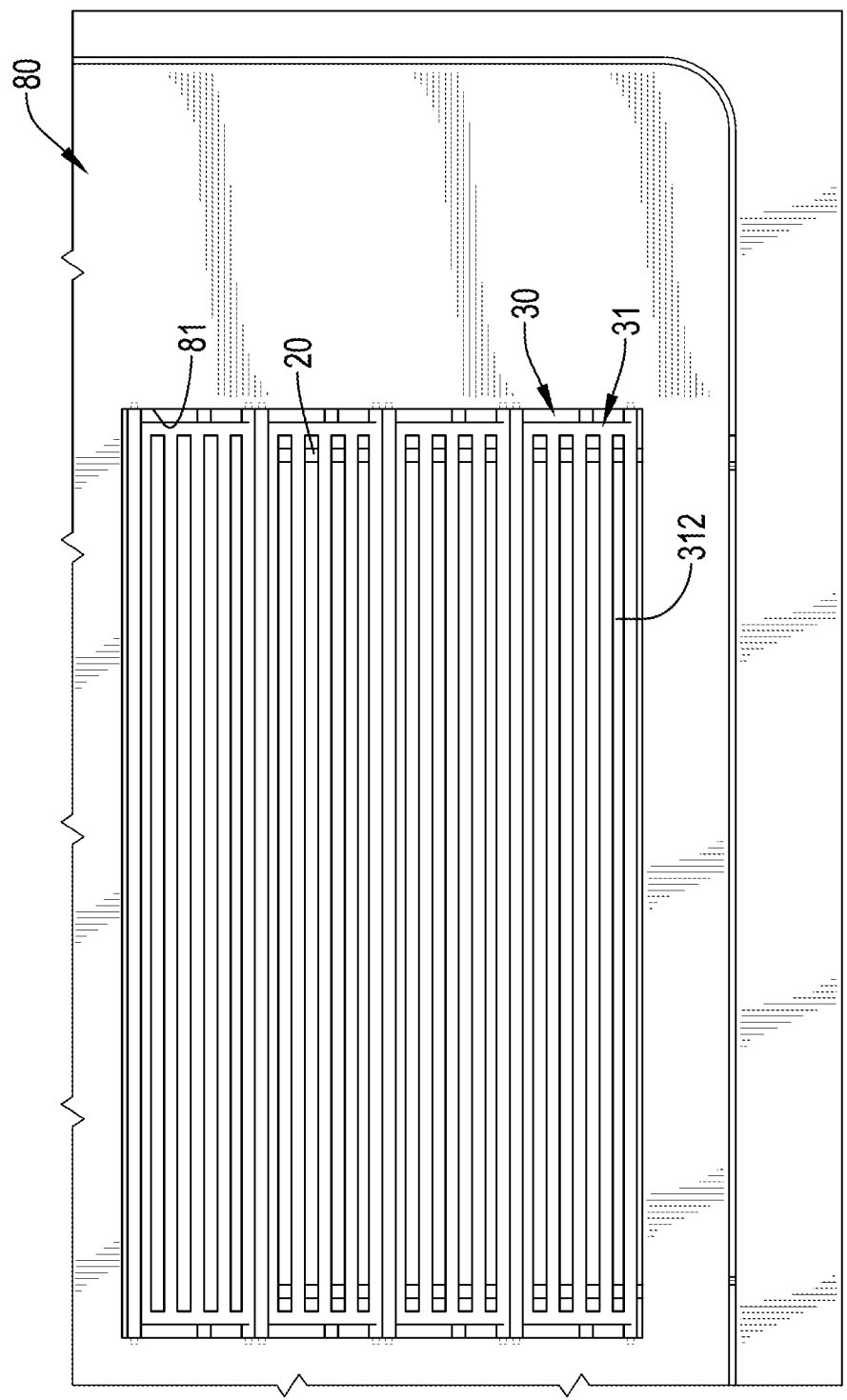
FIG. 8 is a schematic bottom view when a blade group of a linkage fan blade structure of the present disclosure is closed.

Referring to FIG. 2, FIG. 8, and FIG. 9, when the blade group 30 is in the closed state, the sliding end 322 of the second blade 32 is located at the closed end 3111 of the sliding slot 311 of the first blade 31. In this embodiment, in the closed state, the first blade 31 is parallel to the second blade 32, and neither the first blade 31 nor the second blade 32 protrudes out of the opening 81 of the base 80. In addition, in this embodiment, in the closed state, the heat dissipation hole 312 of the first blade 31 is in communication with the heat dissipation hole 324 of the second blade 32. And further, viewing upwards from a bottom surface of the base 80, the location, the shape, and the size of the heat dissipation hole 324 of the second blade 32 respectively correspond to the location, the shape, and the size of the heat dissipation hole 312 of the first blade 31. Therefore, only the heat dissipation hole 312 (as shown in FIG. 8) of the first blade 31 is visible. However, similarly, the present disclosure is not limited thereto. In the closed state, alternatively, the first blade 31 may be not parallel to the second blade 32, and the heat dissipation hole 312 of the first blade 31 and the heat dissipation hole 324 of the second blade 32 may also be changed to another design.

Figure 3:
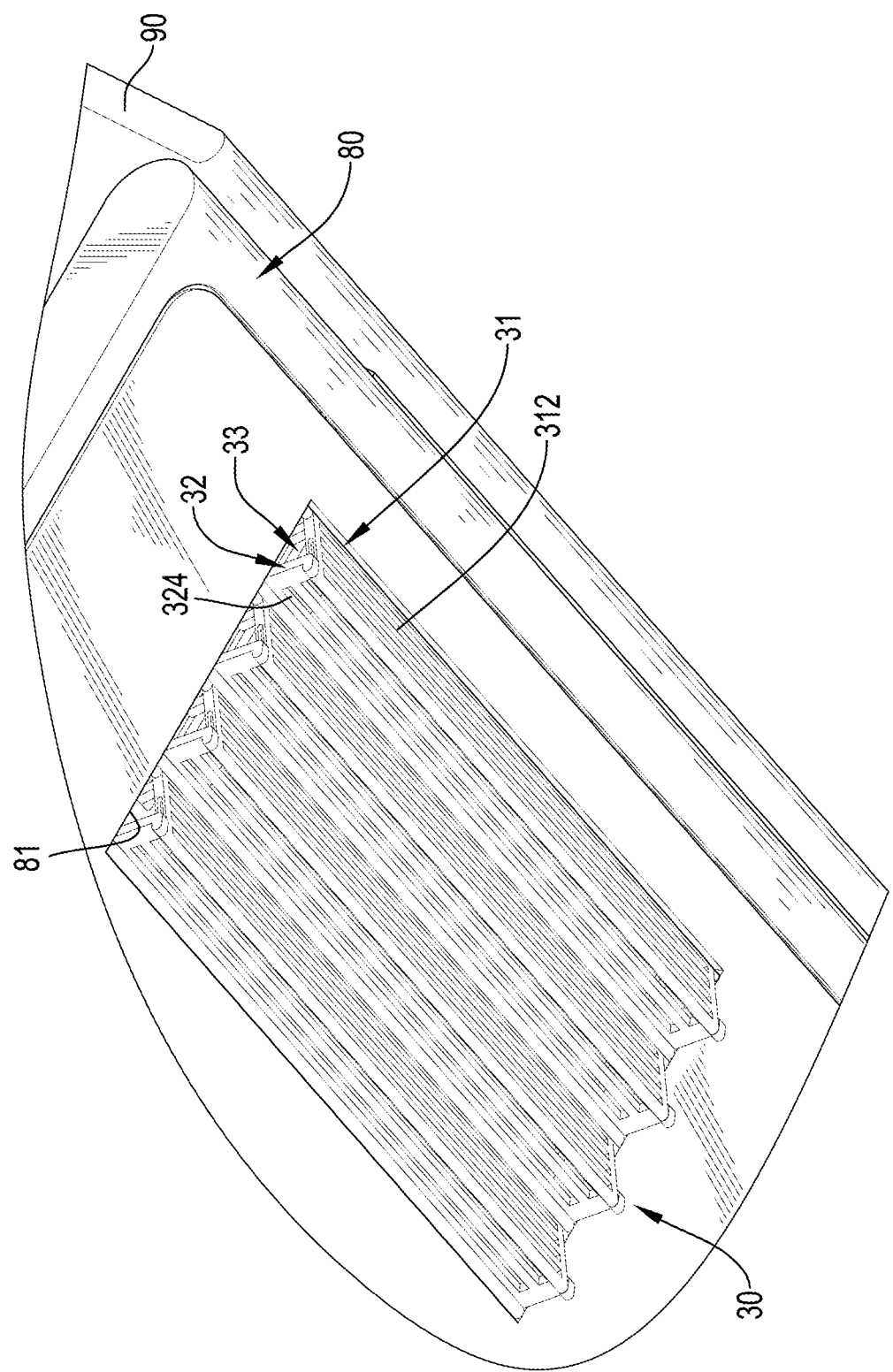
FIG. 3 is a three-dimensional appearance bottom view when a blade group of a linkage fan blade structure of the present disclosure is opened.
Figure 11:
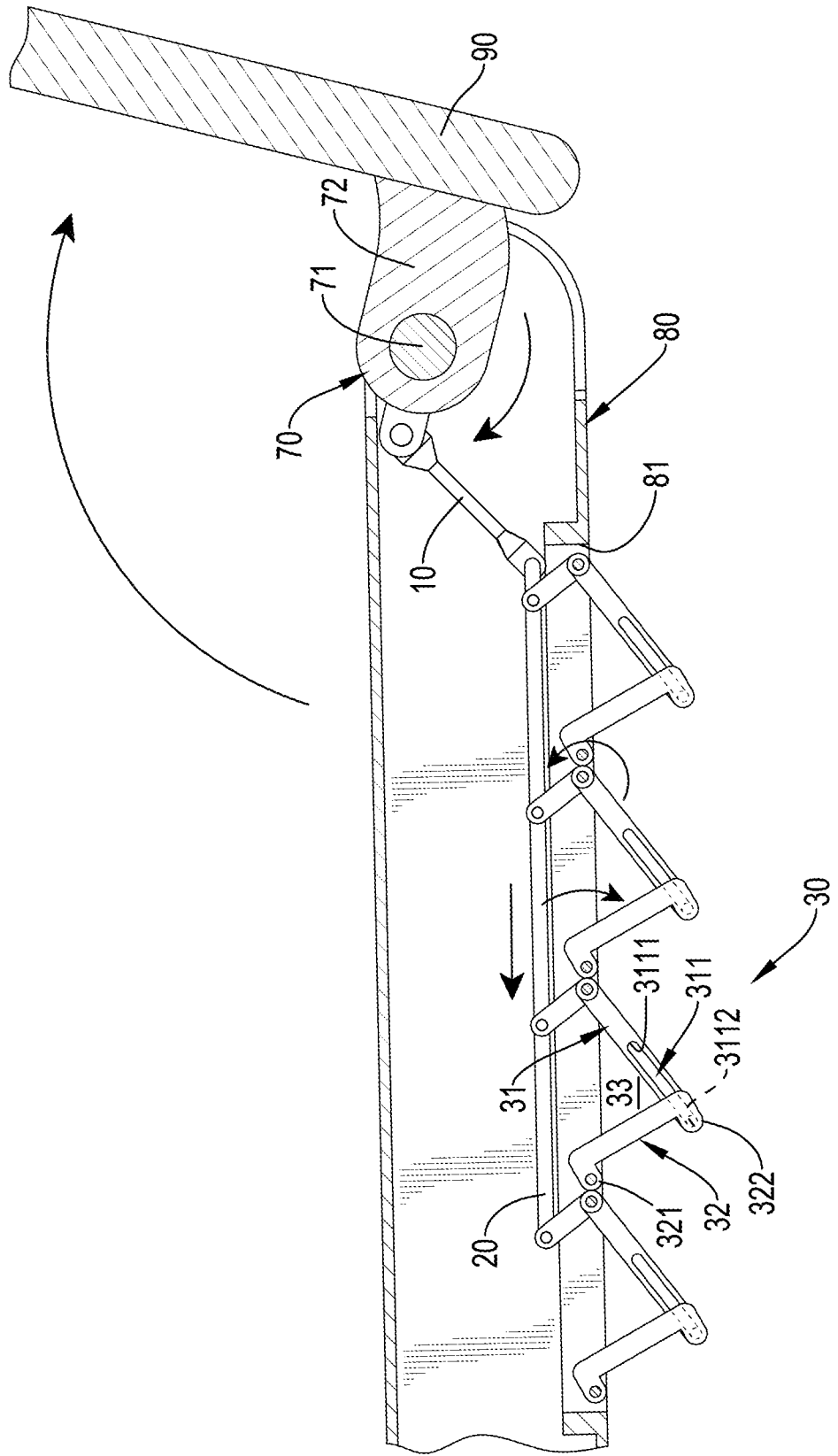

Referring to FIG. 3 and FIG. 11, when the blade group 30 is in the open state, the sliding end 322 of the second blade 32 is located at the open end 3112 of the sliding slot 311 of the first blade 31, so that the first blade 31 is connected to the second blade 32 in an inclined manner, and the first blade 31 and the second blade 32 protrude downwards out of the opening 81 of the base 80 in an inclined manner.

Figure 10:
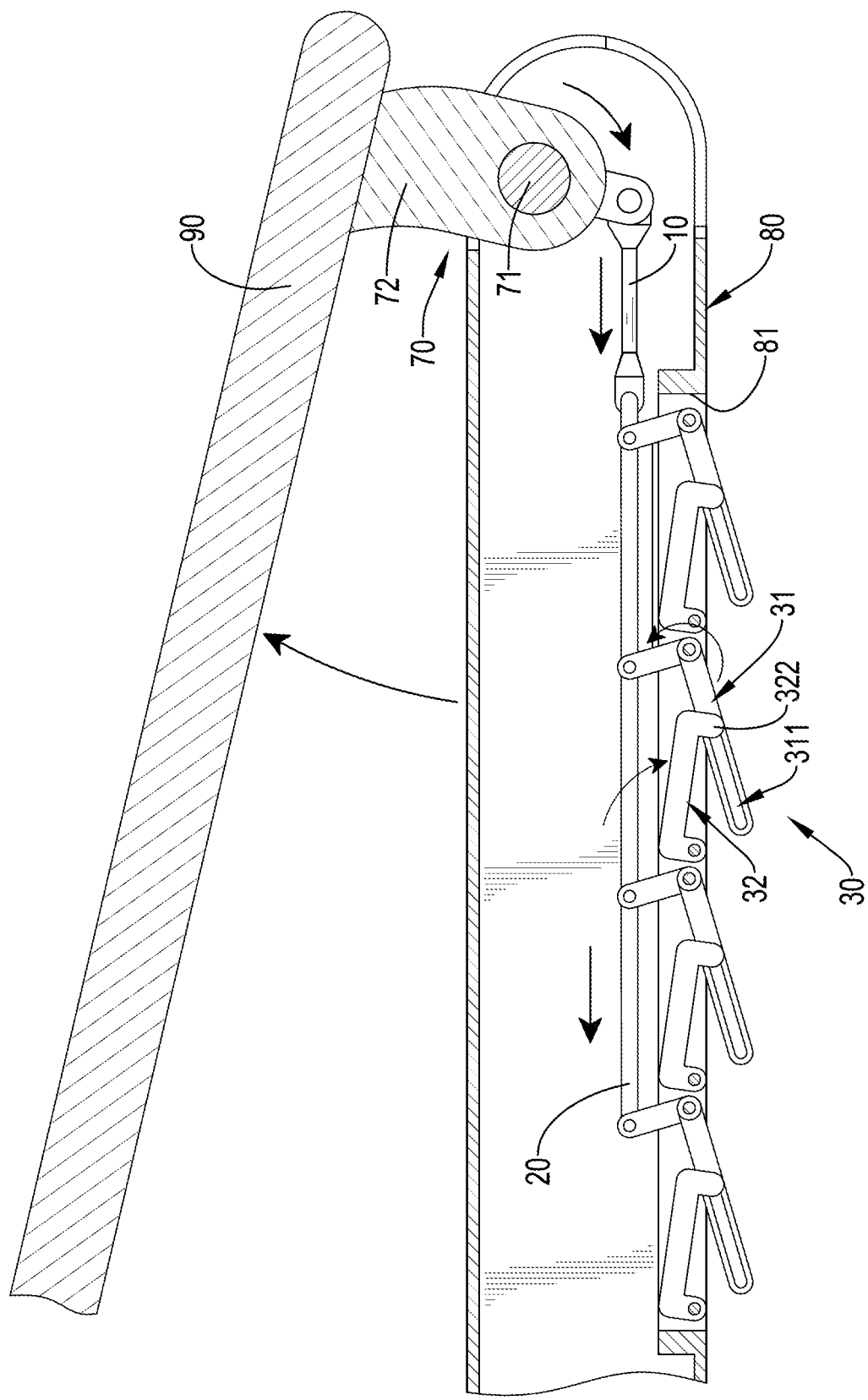

Referring to FIG. 9 to FIG. 11, when the upper cover 90 of the flip-type electronic device is closed relative to the base 80, the blade groups 30 are in the closed state. When the upper cover 90 of the flip-type electronic device is opened relative to the base 80, the pivot 70 pulls or pushes the first connecting rods 10, the first connecting rods 10 drive the second connecting rods 20 to move, and the second connecting rods 20 drive the blade groups 30, so that the blade groups 30 are switched to the open state.

Specifically, there are four manners of driving the blade group 30 by the second connecting rod 20 as described below.

First manner: referring to FIG. 10, the first blade 31 is closer, than the second blade 32, to the pivot 70 of the flip-type electronic device, and the second connecting rod 20 is pivoted to the first blade 31. When the upper cover 90 is opened, the second connecting rod 20 pushes, away from the pivot 70, the first blade 31 to pivotally rotate.

Figure 13:
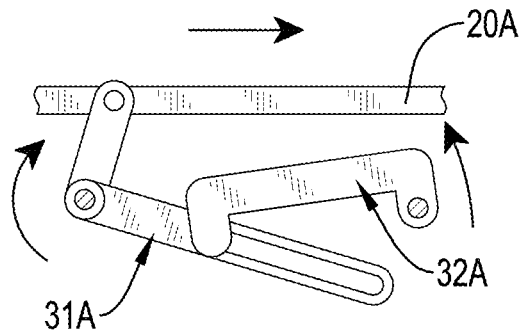
FIG. 13 is an action diagram of a blade group of a second embodiment of a linkage fan blade structure of the present disclosure.

Second manner: referring to FIG. 13, a second blade 32A is closer, than a first blade 31A, to a pivot of a flip-type electronic device, and a second connecting rod 20A is pivoted to the first blade 31A. When an upper cover is opened, the second connecting rod 20A pulls, toward the pivot, the first blade 31A to pivotally rotate.

Figure 14:
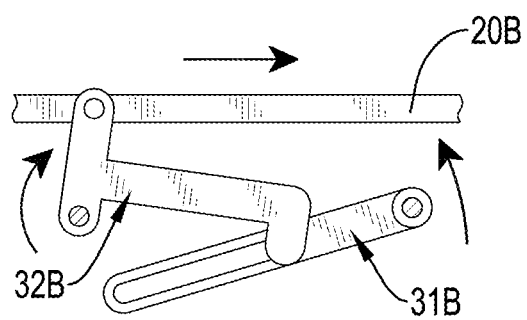
FIG. 14 is an action diagram of a blade group of a third embodiment of a linkage fan blade structure of the present disclosure.

Third manner: referring to FIG. 14, a first blade 31B is closer, than a second blade 32B, to a pivot of a flip-type electronic device, and a second connecting rod 20B is pivoted to the second blade 32B. When an upper cover is opened, the second connecting rod 20B pulls, toward the pivot, the second blade 32B to pivotally rotate.

Figure 15:
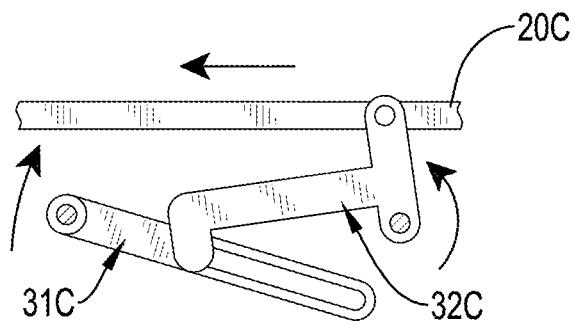
FIG. 15 is an action diagram of a blade group of a fourth embodiment of a linkage fan blade structure of the present disclosure.
Figure 16:
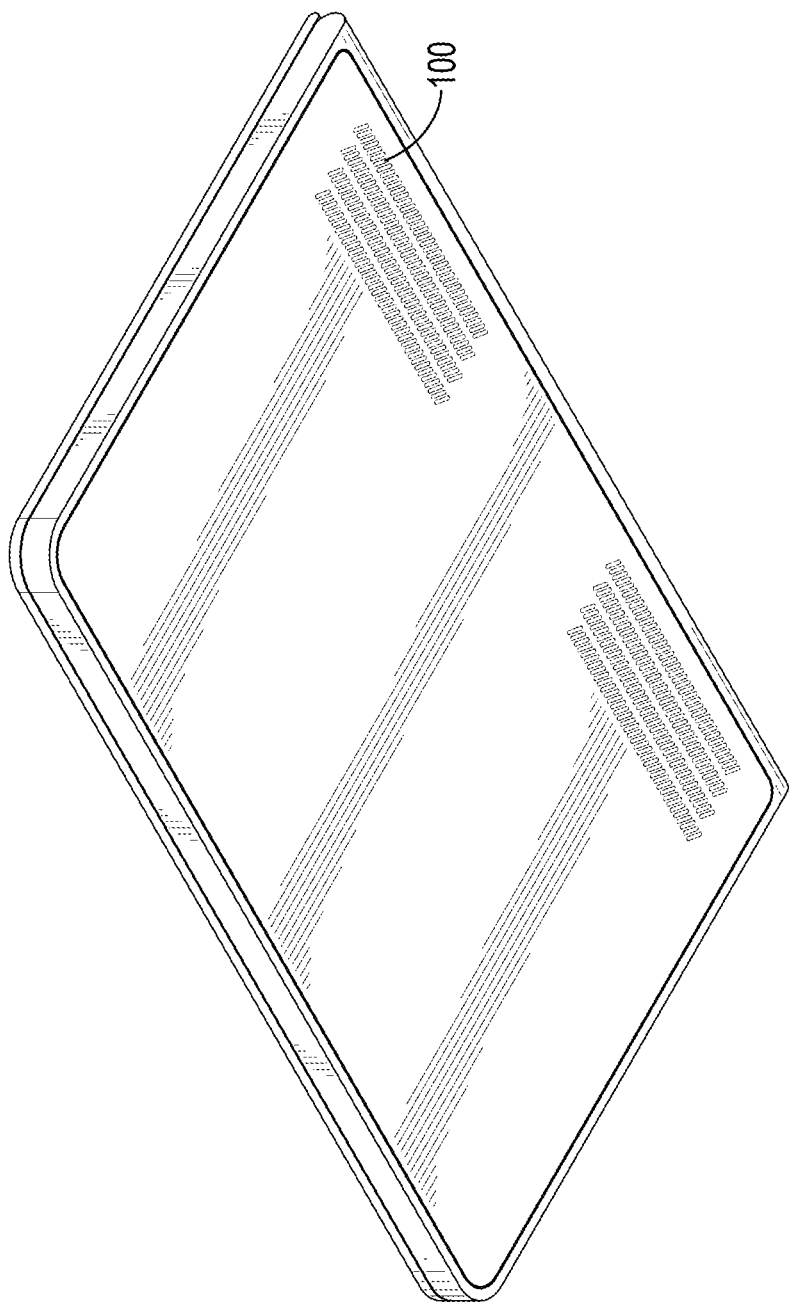
FIG. 16 is a schematic diagram of a heat dissipation hole of a notebook computer in the prior art.

Fourth manner: referring to FIG. 15, a second blade 32C is closer, than a first blade 31C, to a pivot of a flip-type electronic device, and a second connecting rod 20C is pivoted to the second blade 32C. When an upper cover is opened, the second connecting rod 20C pushes, away from the pivot, the second blade 32C to pivotally rotate.

Specifically, if the second connecting rod 20 is pivoted to a blade relatively close to the pivot 70 (as shown in FIG. 10 and FIG. 15), when the upper cover 90 is opened, as long as the second connecting rod 20 is pushed, away from the pivot 70, the blade to pivotally rotate, it can be switched to the open state.

On the contrary, if the second connecting rod 20 is pivoted to a blade relatively far away from the pivot 70 (as shown in FIG. 13 and FIG. 14), when the upper cover 90 is opened, as long as the second connecting rod 20 is pulled, toward to the pivot 70, the blade to pivotally rotate, it can be switched to the open state.

Therefore, whether the second connecting rod 20 moves away from the pivot 70 or toward the pivot 70 when the upper cover 90 is opened can be determined by adjusting the location where the first connecting rod 10 is connected to the pivot 70. For example, in this embodiment, when the upper cover 90 is closed relative to the base 80 and the first connecting rod 10 is connected to a lower part of the pivot 70 (as shown in FIG. 9), a location where the first connecting rod 10 is connected to the pivot 70 moves forward in an upward sloping manner (toward the blade group 30) in a process of opening the upper cover 90, so that the second connecting rod 20 pushes, away from the pivot 70, the blade group 30. On the contrary, when the upper cover 90 is closed relative to the base 80, if the first connecting rod 10 is connected to a front side of the pivot 70, in a process of opening the upper cover 90, a location where the first connecting rod 10 is connected to the pivot 70 moves backward in an upward sloping manner (away from the blade group 30), so that the second connecting rod 20 pulls, toward the pivot 70, the blade group 30.

Based on the above, if the flip-type electronic device of the present disclosure is not in use and the upper cover 90 is closed relative to the base 80, the blade groups 30 are in the closed state. When the flip-type electronic device of the present disclosure is to be used, in a process of opening the upper cover 90, the pivot 70 drives the blade groups 30 through the first connecting rod 10 and the second connecting rod 20, so that the second blade 32 of each of the blade groups 30 slides relative to the first blade 31, and the two blades 31 and 32 respectively pivotally rotate relative to the base 80 and protrude out of the opening 81 of the base 80 in an inclined manner.

In this way, heat in the flip-type electronic device can be discharged from two locations described below.

First, the heat can be discharged in a downward sloping manner from the heat dissipation holes 312 and 324 of the inclined first blade 31 and the inclined second blade 32.

Secondly, two triangular lateral openings 33 (as shown in FIG. 3 and FIG. 11) are formed between the first blade 31 and the second blade 32 that are connected to each other in an inclined manner, and the heat can also be discharged from the two lateral openings 33.

In this way, according to the present disclosure, under the same area of the opening 81, by means of a design that the first blade 31 is connected to the second blade 32 in an inclined manner, there are a relatively large number of heat dissipation holes 312 and 324, to greatly improve the opening rate, and heat may further be discharged from the lateral openings 33. In this way, the present disclosure effectively improves the heat dissipation efficiency.

Figure 12:
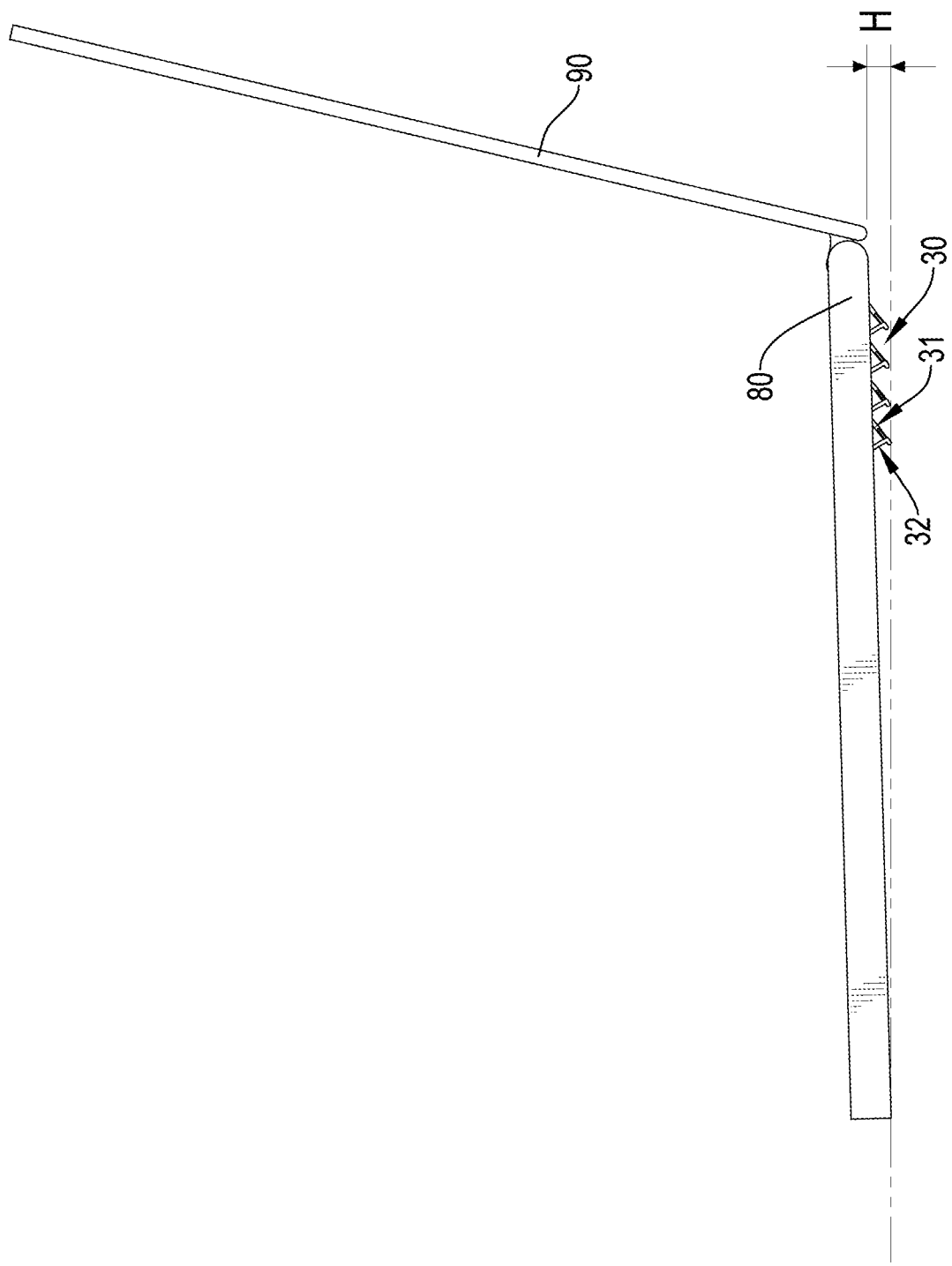
FIG. 12 is a schematic side view when a blade group of a flip-type electronic device of the present disclosure is opened.

In addition, referring to FIG. 12, when the first blade 31 and the second blade 32 protrude out of the opening 81 of the base 80 in an inclined manner, the first blade 31 and the second blade 32 also lift, like a bracket, a rear side of the flip-type electronic device upward. In this way, a rear half part of the base 80 of the flip-type electronic device does not abut against a desktop, and heat dissipation is more facilitated. In this embodiment, the rear side of the flip-type electronic device is lifted by a height H, which is 4.5 mm, but the present disclosure is not limited thereto.

In this embodiment, the first blade 31 of the blade group 30 has two sliding slots 311, but the present disclosure is not limited thereto. Alternatively, the first blade 31 may have only one sliding slot 311, provided that the sliding end 322 of the second blade 32 is slidably pivotally disposed in the sliding slot 311.

In this embodiment, there are two first connecting rods 10 and two second connecting rods 20, but the present disclosure is not limited thereto. Alternatively, there may be only one first connecting rod 10 and only one second connecting rod 20, which may correspond to a central location of the blade group 30. In this way, the blade group 30 can also be driven to be opened and closed.

In this embodiment, the number of the blade groups 30 is plural, but the present disclosure is not limited thereto. Alternatively, there may be only one blade group 30. A better heat dissipation effect can also be achieved provided that the size of the first blade 31 and the size of the second blade 32 are both increased.

In this embodiment, the flip-type electronic device is used together with two linkage fan blade structures, but the present disclosure is not limited thereto. The flip-type electronic device may also be used together with one or more than two linkage fan blade structures.

The above descriptions are merely preferred embodiments of the present disclosure, and are not intended to limit the present disclosure in any form. Although the present disclosure has been disclosed above through the preferred embodiments, the embodiments are not intended to limit the present disclosure. Any person of ordinary skill in the art can make some equivalent variations or modifications to the above-disclosed technical content without departing from the scope of the technical solutions of the present disclosure to obtain equivalent embodiments. Any simple alteration, equivalent change or modification made to the above embodiments according to the technical essence of the present disclosure without departing from the content of the technical solutions of the present disclosure shall fall within the scope of the technical solutions of the present disclosure.

What is claimed is:

1. A linkage fan blade structure, configured to be arranged in a flip-type electronic device, wherein the flip-type electronic device comprises a base, an upper cover, and a pivot, an opening is formed through a bottom surface of the base, the upper cover is pivoted to the base through the pivot, and the linkage fan blade structure comprises:
    at least one first connecting rod, one end of the at least one first connecting rod pivoted to the pivot;
    at least one second connecting rod, one end of the at least one second connecting rod pivoted to another end of the at least one first connecting rod; and
    at least one blade group, pivoted to the at least one second connecting rod and disposed corresponding to the opening, wherein each of the at least one blade group comprises:
    a first blade, pivoted to an inner surface of the opening, the first blade comprising at least one sliding slot, each of the at least one sliding slot comprising a closed end and an open end, and the closed end being closer, than the open end, to a location where the first blade is pivoted to the opening; and
    a second blade, pivoted to the inner surface of the opening, the second blade comprising a sliding end, and the sliding end slidably pivoted to the at least one sliding slot of the first blade.

2. The linkage fan blade structure according to claim 1, wherein the at least one blade group comprises a closed state and an open state; when the at least one blade group is in the closed state, the sliding end of the second blade is located at the closed end of the at least one sliding slot; and when the at least one blade group is in the open state, the sliding end of the second blade is located at the open end of the at least one sliding slot, and the first blade and the second blade protrude out of the opening.

3. The linkage fan blade structure according to claim 2, wherein when the upper cover of the flip-type electronic device is closed relative to the base, the at least one blade group is in the closed state; and when the upper cover of the flip-type electronic device is opened relative to the base, the pivot drives, through the at least one first connecting rod, the at least one second connecting rod to move, and the at least one second connecting rod drives the at least one blade group, so that the at least one blade group switches to the open state.

4. The linkage fan blade structure according to claim 2, wherein the first blade and the second blade each comprise at least one heat dissipation hole, and when the at least one blade group is in the closed state, the first blade is parallel to the second blade, and the at least one heat dissipation hole of the first blade is in communication with the at least one heat dissipation hole of the second blade.

5. The linkage fan blade structure according to claim 1, wherein the at least one second connecting rod is pivoted to the first blade of the at least one blade group.

6. The linkage fan blade structure according to claim 1, wherein the first blade is closer, than the second blade, to the pivot of the flip-type electronic device.

7. The linkage fan blade structure according to claim 1, wherein
    a number of the at least one sliding slot of the first blade is two, and the two sliding slots are respectively disposed on two opposite sides of the first blade; and two opposite sides of the sliding end of the second blade are respectively located on outer sides of the two sliding slots of the first blade, and each of the two opposite sides of the sliding end of the second blade is provided with a sliding column, and the sliding column is slidably and relatively rotatably disposed in a corresponding one of the two sliding slots.

8. The linkage fan blade structure according to claim 1, wherein a number of the at least one first connecting rod is two; and a number of the at least one second connecting rod is two, and the two second connecting rods are respectively pivoted to the two first connecting rods.

9. The linkage fan blade structure according to claim 1, wherein a number of the at least one blade group is plural, and the blade groups are arranged along an extension direction of the at least one second connecting rod.

10. A flip-type electronic device, comprising:

a base;

an upper cover;

a pivot, wherein the upper cover is pivoted to the base through the pivot; and at least one linkage fan blade structure according to claim 1, disposed on the base, and connected to the pivot.

11. The flip-type electronic device according to claim 10, wherein the pivot comprises a shaft body and an upper-cover combination base, the upper-cover combination base is relatively rotatably sleeved on the shaft body, the upper cover is combined with the upper-cover combination base, and the linkage fan blade structure is connected to the upper-cover combination base.

* * * * *